United States Patent
Cho et al.

(10) Patent No.: US 8,675,424 B2
(45) Date of Patent: Mar. 18, 2014

(54) SEPARATE READ/WRITE COLUMN SELECT CONTROL

(75) Inventors: Hoyeol Cho, Palo Alto, CA (US); Ioannis Orginos, Sunnyvale, CA (US); Daniel Fung, Fremont, CA (US)

(73) Assignee: Oracle International Corporation, Redwood Shores, CA (US)

( * ) Notice: Subject to any disclaimer, the term of this patent is extended or adjusted under 35 U.S.C. 154(b) by 46 days.

(21) Appl. No.: 13/416,270

(22) Filed: Mar. 9, 2012

(65) Prior Publication Data

US 2013/0235680 A1    Sep. 12, 2013

(51) Int. Cl.
*G11C 7/00*    (2006.01)
*G11C 7/22*    (2006.01)

(52) U.S. Cl.
CPC .......................................... *G11C 7/22* (2013.01)
USPC ................. 365/191; 365/230.03; 365/230.06; 365/196; 365/189.07; 365/230.05

(58) Field of Classification Search
CPC ............. G11C 11/005; G11C 11/4087; G11C 11/418; G11C 29/025; G11C 29/18; G11C 29/50012; G11C 7/12; G11C 8/08; G11C 8/12
USPC ........ 365/230.03, 230.06, 196, 191, 189.011, 365/189.07, 230.05
See application file for complete search history.

(56) References Cited

U.S. PATENT DOCUMENTS 7,643,330 B1 *   1/2010   Lin et al. ........................ 365/154

* cited by examiner

*Primary Examiner* — Thong Q Le
(74) *Attorney, Agent, or Firm* — Kraguljac Law Group, LLC

(57) ABSTRACT

Systems and methods are described herein that reduce the read latency of a cache by separating read and write column select signals that cause the cache to initiate certain read and write operations, respectively.

19 Claims, 6 Drawing Sheets

SEPARATE READ/WRITE COLUMN SELECT CONTROL

BACKGROUND

One important indicator of a microprocessor's performance is the speed with which the microprocessor can access data stored in memory. Multi-level cache systems are often employed to increase the speed of data access by storing data from frequently accessed memory locations in one or more caches. The microprocessor can access the data in the caches much faster than it can access data from main memory. The amount of time, or number of clock cycles, that elapses between when a location in cache is selected for reading or writing and when the data is available at the cache's output for access by the microprocessor is called the "latency" of the cache. Typically, the read latency of a cache is greater than the write latency because of the time it takes to place data values at the output of the cache (as opposed to simply inputting new values for writing). Thus, in general, caches having a low read latency can significantly increase the performance of the microprocessor.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. One of ordinary skill in the art will appreciate that in some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems and methods are described herein that reduce the read latency of a cache by separating read and write column select signals that cause the cache to initiate certain read and write operations, respectively. Specifically, the read column select signal is delayed while hardware is preparing to provide data at the cache's output. In one embodiment, the read latency can be reduced from three clock cycles to two clock cycles, resulting in an overall improvement of about 10 percent in cache latency.

Figure 1:
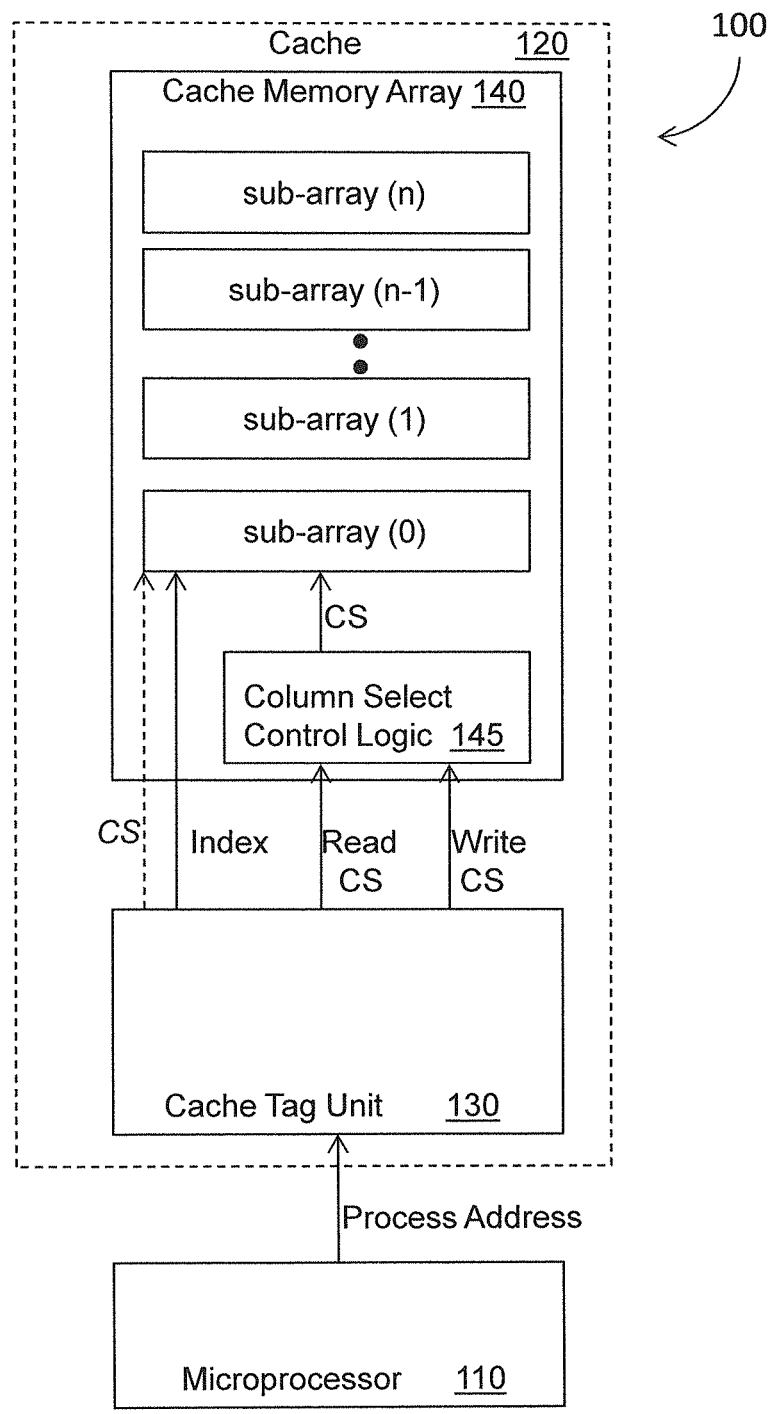
FIG. 1 illustrates one embodiment of a cache system associated with separate read and write column select control.

With reference to FIG. 1, one embodiment of a cache system 100 associated with separate read and write column select control is illustrated. The cache system 100 includes a microprocessor 110 and a cache 120. The microprocessor 110 may include internal caches (not shown). The cache 120 is external to the microprocessor 100, however, the speed with which the microprocessor accesses data in the cache 120 is a factor in rating the performance of the microprocessor. The cache 120 includes a cache tag unit 130 and a cache memory array 140. The cache memory array 140 is divided into sub-arrays 0-n, each of which includes memory cells that can be identified by word line and column. The cache memory array locates a memory cell based on a word line, a column select value, and an array select signal that specifies a single sub-array. In one embodiment, the cache 120 is implemented using Static Random Access Memory (SRAM) as will be described in more detail with respect to FIG. 1A.

The cache tag unit 130 receives a process address that corresponds to a logical memory location storing data being requested by the microprocessor 110. The cache tag unit 130 performs several operations on the process address. For example, the cache tag unit 130 provides an index value, which is typically a selected portion of the process address, to the cache memory array 140. The index value is used by the cache memory array 140 to select a sub array and to select a row (e.g., word line) in the selected sub-array.

The cache tag unit 130 also determines a read column select (CS) signal that specifies a column in the memory array that holds data to be read or a write CS signal that specifies a column (e.g., pair of bit lines) in the memory array to which data is to be written. The read and write CS signals are typically provided when the cache tag unit 120 determines that the process address is present in the cache and that the data in the cache for that process address is valid.

The CS signal is sometimes referred to as the "way" signal, with reference to an associative cache in which any particular process address can be cached in a limited number of "ways" or columns in a cache. Prior art cache tag units provide a single CS signal (shown in dotted line) to the cache memory array 140. This single CS signal is provided when the process address is determined to be present and valid, regardless of whether the process address was provided as part of a read operation or a write operation. The operation of the prior art cache is explained in more detail with reference to FIG. 3.

The cache tag unit 130 provides a separate read CS signal and write CS signal to a column select control logic 145. The column select control logic 145 generates the CS signal for the cache memory array 140 based on the separate read and write CS signals. The timing according to which the CS signal is provided depends on whether the cache 120 is being read from or written to. When the column select control logic 145 receives a write CS, it provides the CS signal to the cache memory array 140 immediately. Thus, the write operation occurs in the same timing as the prior art cache discussed above. When the column select logic control 145 receives a read CS, it delays providing the CS to the cache memory array 140 for a predetermined amount of time (e.g., one clock cycle). While only a single column select control logic 145 is shown in FIG. 1, in one embodiment, each memory sub-array has a column select control logic 145.

As will be described in more detail with respect to FIGS. 3 and 4, even though the read CS is delayed by the column select control logic 145, the read operation finishes (e.g., data present at cache output) at the same time as the read operation would have finished without the delay in receiving the CS signal. Thus, delaying the CS signal reduces read latency because the latency period begins with the CS signal and ends with the data being present at the cache output.

Figure 1A:
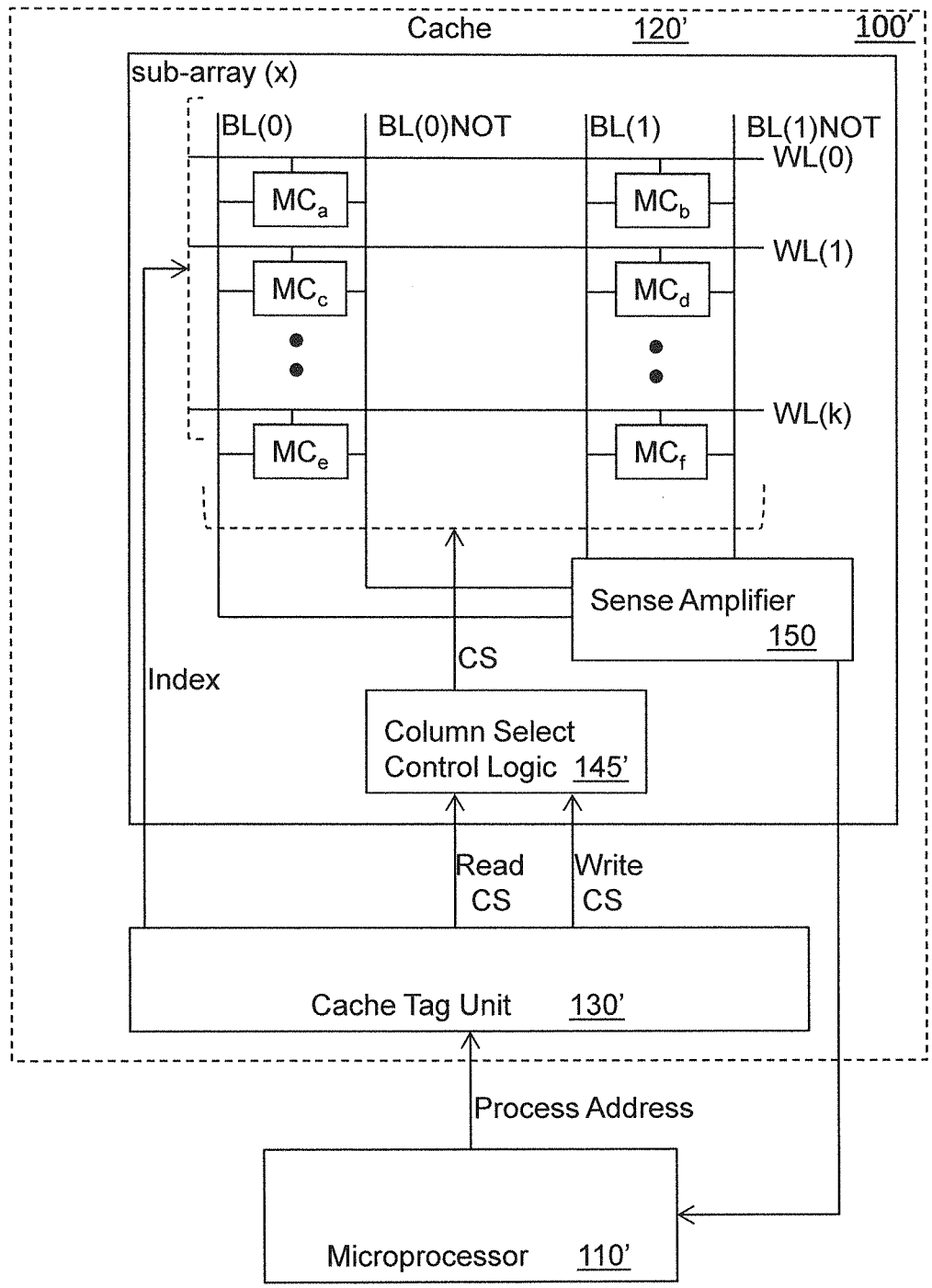
FIG. 1A illustrates one embodiment of a cache system associated with separate read and write column select control.

FIG. 1A illustrates one embodiment of a cache system 100' associated with separate read and write column select control in which a cache 120' is implemented using SRAM. The detailed operation of the SRAM is not provided herein and only selected aspects of the SRAM that are relevant to the systems and methods described herein will be discussed. FIG. 1A illustrates one particular embodiment of the cache system 100 of FIG. 1. For simplicity, analogous components are given the same reference character as found in FIG. 1, but the reference characters are designated as prime (e.g. 100 is analogous to 100'). While a single sub-array, sub-array (x) is shown in FIG. 1A, more than one sub-array is typically used in caches.

The sub-array x memory cells (MC) arranged in a matrix. Individual rows of memory cells are controlled by word lines (WL(0), WL(1), WL(k)). For example, in FIG. 1A, memory cells $MC_a$ and $MC_b$ are both controlled or selected by word line WL(0). Individual columns of memory cells are connected to pairs of corresponding pairs of bit lines. For example, in FIG. 1A, memory cells $MC_a$, $M_c$ and $MC_e$ are capable of being connected to the pair of bit lines BL(0) and BL(0)NOT. BL(0)NOT corresponds to the inverse of the bit value on BL(0). The sub-array (x) also includes a sense amplifier 150 that is connected to the bit lines and outputs contents of a selected memory cell as provided by the bit lines.

The sub array (x) is configured to input an index signal and column select signal from the cache tag unit 130' and column select control logic 145', respectively. In response, the sub-array (x) selects a word line specified by the index signal and a column specified by the column select signal to access a memory cell. The index signal is received during a first time interval. The memory cell controlled by the selected word line is connected to the bit lines upon receipt of the index signal in the first time interval. The bit lines are not connected to the sense amplifier until receipt of the column select signal during the second time interval. Thus during the first time interval the bit lines are charging (and/or discharging) by virtue of being connected to the selected memory cell. During the second time interval the bit lines are connected to the sense amplifier. Thus, in some embodiments, the first time interval may be selected to correspond to a time period after receipt of the index signal during which a bit line charges to a threshold level prior to being connected to the sense amplifier. The first and second time intervals may also be described in terms of clock cycles as will be discussed below in connection with FIG. 2.

Figure 2:
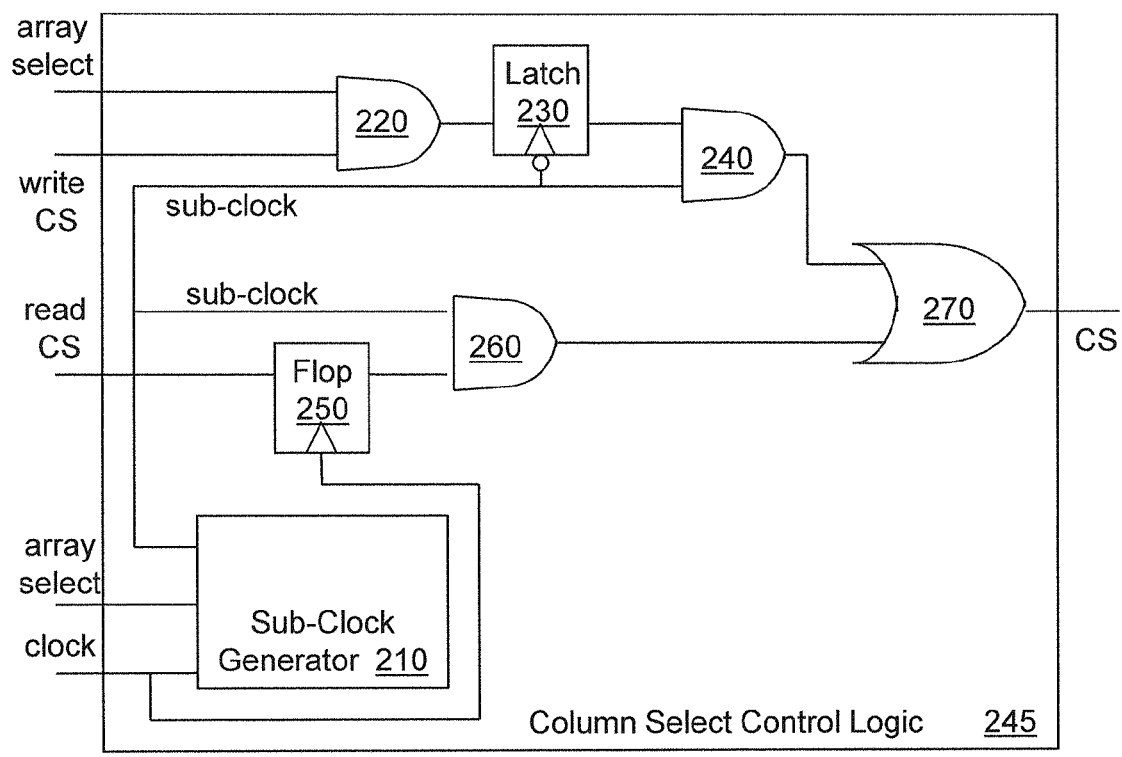
FIG. 2 illustrates one embodiment of a column select signal generation circuit associated with separate read and write column select control.

FIG. 2 illustrates one embodiment of a column select control logic 245 that provides a CS signal based on a write CS signal and a read CS signal (e.g., as provided by the cache tag unit 130). In addition to the read and write CS signals, the column select control logic 245 also inputs a clock signal that may correspond to a processor clock. The column select control logic 245 also inputs an array select signal that indicates that an array associated with the column select control logic 245 contains data for the requested memory location.

The column select control logic 245 includes a sub-clock generator 210 that generates a slower clock signal used to time the output of the CS signal by the column select control logic 245. The sub-clock generator 210 is enabled when the array select signal is high. The sub-clock generator 210 generates a sub-clock signal having a period about 1.5 times the period of the clock signal. The length of the sub-clock signal may be selected based on the amount of time it takes for a bit line to charge to a threshold level after a memory cell is selected, as discussed above. Other particular timing schemes may also be used, depending on circuit requirements.

The write CS is input to AND gate 220 with the array select signal. When the array is selected, the output of the AND operation will correspond to the value of the write CS. The output of the AND gate 220 is latched in latch 230 when the slower sub-clock signal goes high. The value stored in the latch is provided to the AND gate 240. While the sub-clock signal is high, the output of the AND gate 240 will correspond to the value of the write CS. Thus, whenever the sub-clock is high, the value of write CS is present at the input to an OR gate 270, the output of which is the CS signal.

The read CS is input to a flip flop circuit 250 that stores the value of the read CS input when the clock signal (not sub-clock) goes high. When the clock signal goes high again, the read CS input stored in the flip flop 250 is provided at the input to AND gate 260. When the sub-clock is high, the output of the AND gate 260 corresponds to the read CS value. The read CS value output by the AND gate is delayed by being stored in the flip flop 250 during the time between the clock cycle going high a second time and the sub-clock cycle subsequently going high. This delayed read CS value from the AND gate 260 is present at the input to the OR gate 270 that outputs the CS signal. In summary, by virtue of the OR gate, the column select control logic 245 outputs the CS signal "immediately" upon receiving the write CS signal and delays output of the CS signal when a read CS signal is received.

Figure 3:
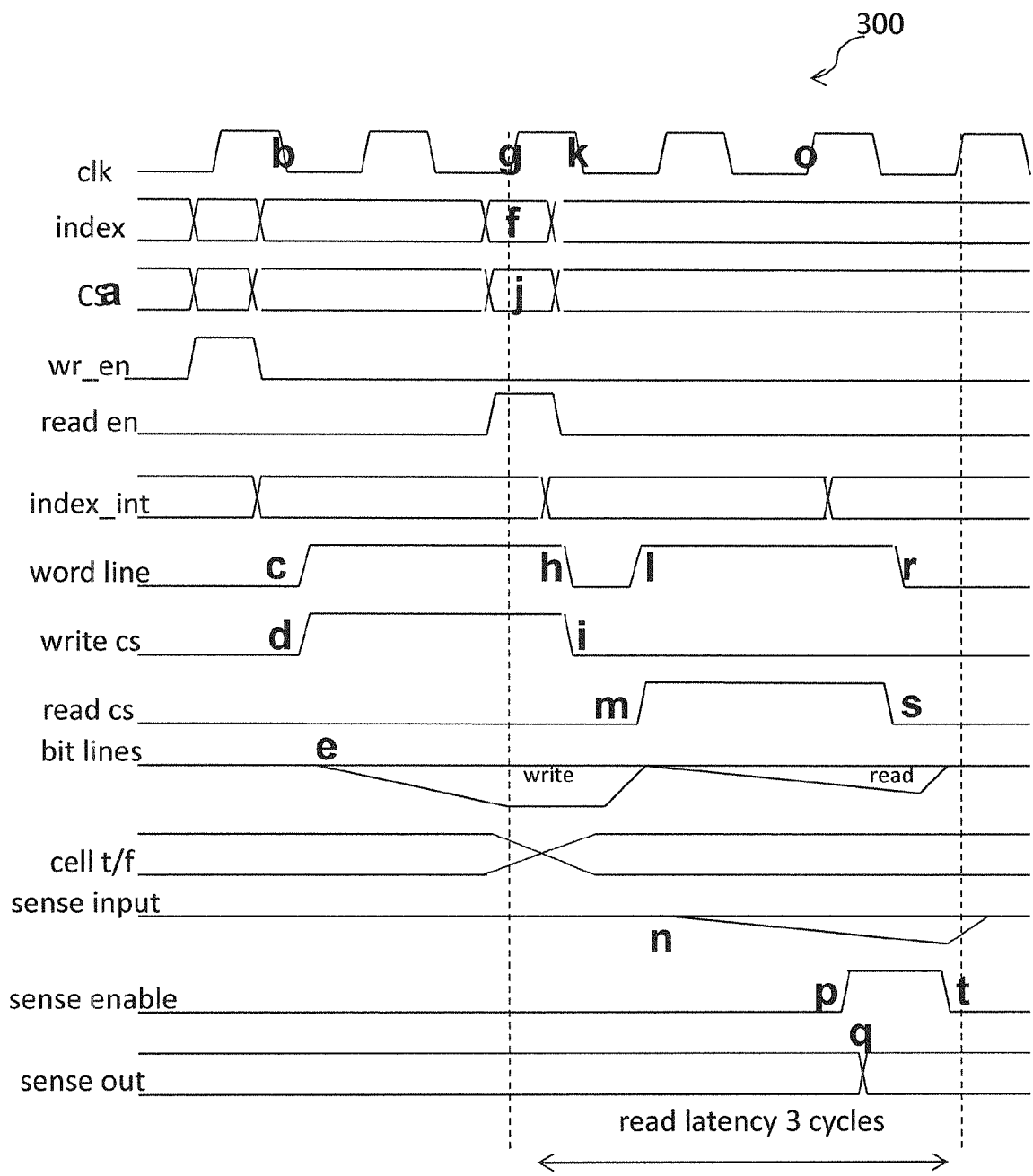
FIG. 3 illustrates one embodiment of a timing diagram associated with combined read and write column select control.

FIG. 3 illustrates a timing diagram for a prior art cache in which the read column select and write column select are not separated (recall dotted line CS in FIG. 1). During a write operation, the index signal and the CS signal (a) are generated concurrently by the cache tag unit. Because these signals are present, on the falling clock pulse (b), the word line (c) is enabled and the write column select signal is provided to the memory array (d). The write cs signal causes the data presented to the cache to be written to the bit lines that communicate data to the memory cells (e), completing the write operation.

During a read operation, data values stored in memory cells must be detected by sense amplifiers that are part of the cache memory array. The sense amplifiers are connected to bit lines that in turn communicate with the memory cells that hold the data values. The index signal (f) is generated by the cache tag unit. Because the index signal is present, at the rising edge of the clock pulse (g) the word line is disabled (h) and the write column select is also disabled (i). The CS signal (j) is generated concurrently with the index signal. The CS signal (j) causes, at the falling edge (k), the word line to be enabled at (l) and the read CS signal to be provided (m) to the memory array. When the read CS signal is provided to the memory array, the sense amplifier input is enabled at (n). This connects the bit lines to the sense amplifier. During this time, the bit line is being developed while connected to the sense amplifier. Thus the read data from the memory cell is discharging one of the bit lines as well as being input to the sense amplifier. This results in a relatively slow accumulation of the read data at the sense amplifier input, as compared to rate of charge accumulation on the sense amplifier input during a read operation performed according to one embodiment of the present invention and shown in FIG. 4.

On rising edge (o), the sense amplifier enable (p) and sense amplifier output (q) are activated so that the data can be read from the sense amplifier. Then word line is disabled (r) and the read CS signal is no longer provided to the memory array (s). The read latency, which is calculated as the time between the column select (j) and the end of the enablement of the sense amplifier (t), is three clock cycles.

Figure 4:
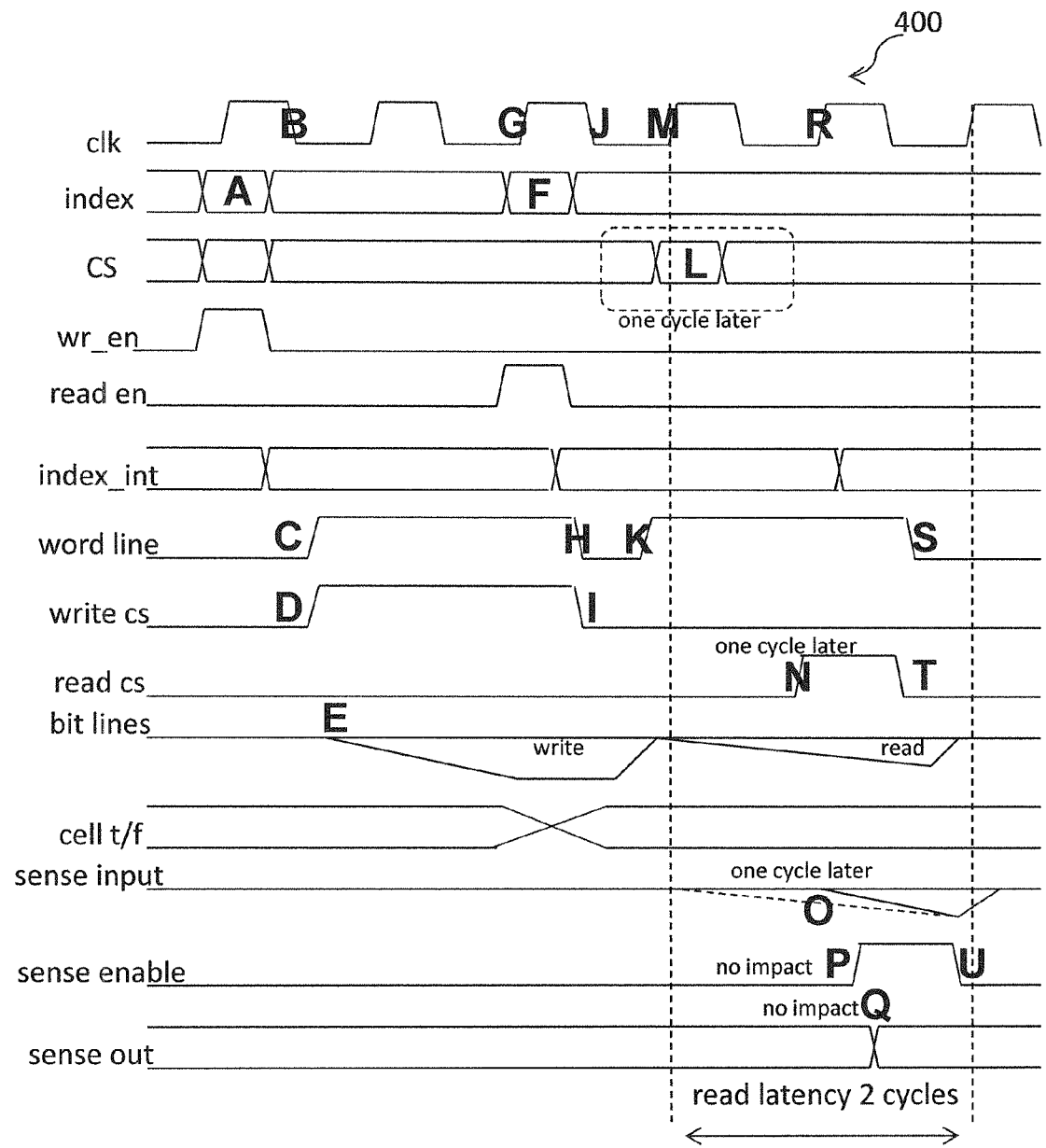
FIG. 4 illustrates one embodiment of a timing diagram associated with separate read and write column select control.

FIG. 4 illustrates a timing diagram for an example embodiment of a cache that features separate read/write column select control, in which the read column select and write column select are separated (e.g., read CS and write CS in FIG. 1). During a write operation, the index signal and the CS signal (A) are generated concurrently by the cache tag unit. Because these signals are present, on the falling clock pulse (B), the word line (C) is enabled and the write column select signal is provided to the memory array (D). The write CS signal causes the data presented to the cache to be written to the bit lines that communicate data to the memory cells (E), completing the write operation. It can be seen by comparing FIGS. 3 and 4 that the write operation time is not affected by separating the write CS signal from the read CS signal.

During a read operation, the index signal (F) is generated by the cache tag unit. Because the index signal is present, at the rising edge of the clock pulse (G) the word line is disabled (H) and the write column select is also disabled (I). At the falling edge (J), the word line is enabled (K). At this point, memory cells selected by the word line are connected to the bit lines. Rather than being generated concurrently with the index signal, the CS signal (L) is generated one clock cycle after the index signal. The CS signal (L) causes, at the rising edge (M), the read CS signal to be provided to the memory array (N) one cycle later than in FIG. 3.

When the read CS signal is provided to the memory array, the sense amplifier input is enabled at (O). This connects the bit line to the sense amplifier after the bit line has been discharged by the memory cell for a clock cycle. One clock cycle later, the bit line is connected to the input of the sense amplifier at (O). Now there is charge sharing between the bit line and the input of the sense amplifier. Because the differential value between the bit line and sense amplifier is relatively large when they are connected at (O), the sense amplifier will charge quickly.

This difference in the rate of input charging can be seen by comparing the dashed line, which corresponds to the input charging in the prior art timing shown in FIG. 3 with the solid line at O. Due to the increase rate of charging of the sense amplifier input, on rising edge (R) the sense enable (P) and sense output (Q) can be enabled and the data will be available on the sense amplifier at the same time as it was available in the prior art timing shown in FIG. 3. Then the word line is disabled (S) and the read CS signal is no longer provided to the memory array (T). The read latency, which is calculated as the time between the column select (L) and the end of the enablement of the sense amplifier (U), is two clock cycles. This is one clock cycle less than the read latency of the prior art cache described in FIG. 3.

Figure 5:
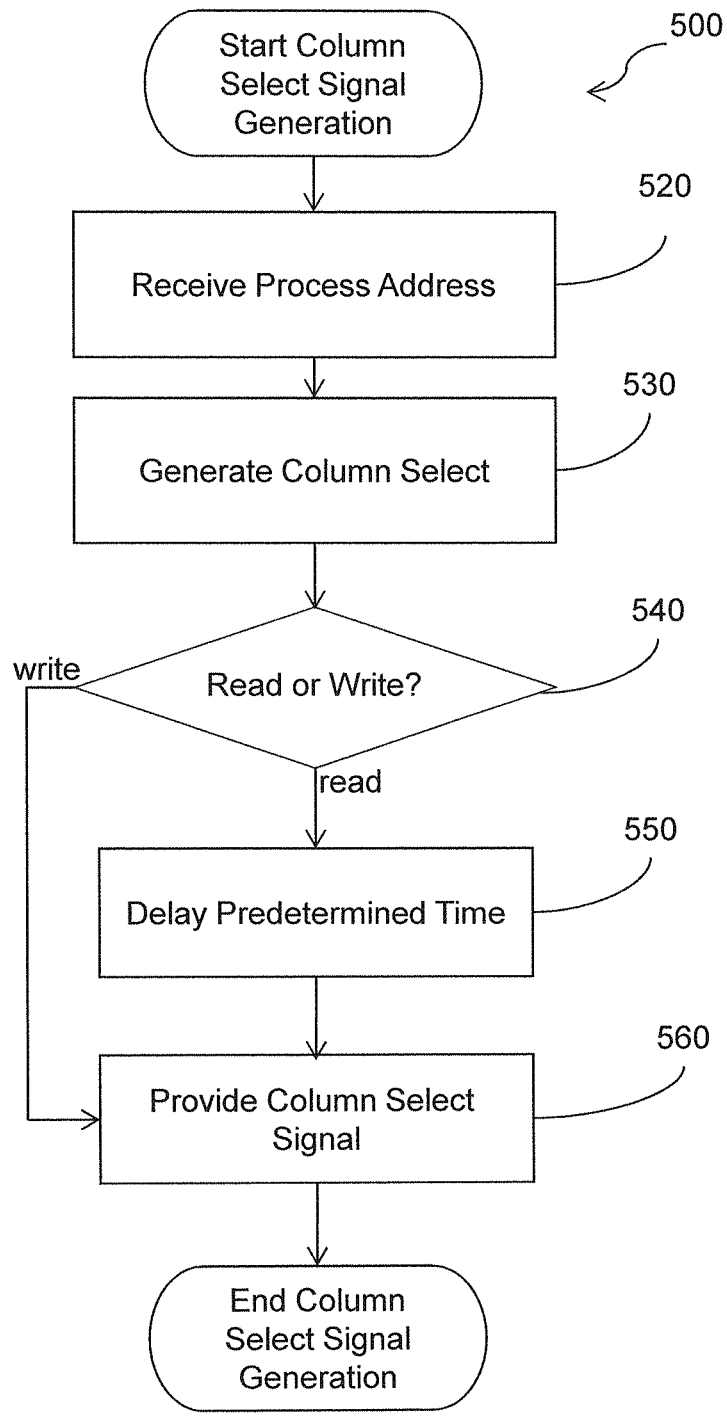
FIG. 5 illustrates one embodiment of a method associated with generating a column select signal based on separate read and write column select control signals.

FIG. 5 illustrates one embodiment of a method 500 that generates a column select signal based on separate read and write column select signals. The method includes, at 520, receiving a process address specifying a logical memory location to be read from a memory. At 530, based on the process address, the method includes generating, during a first clock cycle, a read column select signal that specifies a column in the memory that stores data corresponding to process address. At 540 it is determined that the column select signal is associated with a read operation. At 550, the method includes delaying by a predetermined time so that, at 560, during a second clock cycle, a column select signal corresponding to the read column select signal is provided to the memory. The column select signal is not provided to the memory during the first clock cycle. The second clock cycle is may be immediately subsequent to the first clock cycle, or in other embodiments, the column select signal may be delayed by more than a single clock cycle. If at 540 it is determined that the column select signal is associated with a write operation, the method includes immediately providing the column select signal at 560.

The providing of the column select signal may be performed by performing a logical OR operation on the read column select signal and the write column select signal to produce the column select signal. The logical OR may be performed on a delayed version of the read column select signal and the write column select signal to produce the column select signal. The method may include storing the read column select signal in a flip flop circuit, where the output of the flip flop circuit is the read column select signal.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. An apparatus, comprising:
a cache memory configured as an array of memory cells, wherein each memory cell is uniquely identifiable by a word line and column; and
a cache controller comprising a column select control logic configured to receive a read column select signal and, in response, to provide a column select signal that corresponds to the read column select signal to the cache memory, wherein the column select signal specifies a column of memory cells in the cache memory;
wherein the column select control logic is configured to receive the read column select signal during a first time interval and to provide the column select signal to the cache memory during a second time interval such that the column select signal is not provided to the cache memory during the first time interval.

2. The apparatus of claim 1 wherein the first time interval comprises a first clock cycle and the second time interval comprises a second clock cycle that is immediately subsequent to the first clock cycle.

3. The apparatus of claim 1 wherein:
the cache memory comprises a Static Random Access Memory (SRAM) that includes memory cells arranged in rows controlled by word lines and columns corresponding to bit lines; the SRAM further including a sense amplifier that outputs contents of a selected memory cell as provided by the bit lines;
wherein the SRAM is configured to input an index signal and column select signal and, in response, to select a word line specified by the index signal and a column specified by the column select signal to access a memory cell, wherein the index signal is received during the first time interval;
and further wherein a memory cell controlled by the selected word line is connected to the bit lines upon receipt by the cache memory of the index signal, and wherein the bit lines are connected to the sense amplifier upon receipt by the cache memory of the column select signal; and
wherein the first time interval is selected to correspond to a time period after receipt of the index signal by the cache memory during which a bit line reaches a threshold charge level prior to being connected to the sense amplifier.

4. The apparatus of claim 1 wherein the column select control logic is further configured to receive a write column select signal in a third time interval and to provide a column select signal corresponding to the write column select signal during the third time interval such that the column select signal is provided to the cache memory during the third time interval.

5. The apparatus of claim 1 wherein the column select control logic includes a delay element that stores the read column select signal for the first time interval prior to outputting the read column select signal.

6. The apparatus of claim 4 wherein the column select control logic is configured to perform a logical OR operation on the write column select signal and a delayed version of the read column select signal.

7. A method comprising:
receiving a process address specifying a logical memory location to be read from a memory;
based on the process address, generating, during a first time interval, a read column select signal that specifies a column in the memory that stores data corresponding to process address;
storing the read column select signal in a delay element, wherein the output of the delay element is a delayed version of the read column select signal; and
providing, during a second time interval, the output of the delay element as a column select signal;
such that the column select signal is not provided to the memory during the first time interval.

8. The method of claim 7 wherein the first time interval comprises a first clock cycle and the second time interval comprises a second clock cycle that is immediately subsequent to the first clock cycle.

9. The method of claim 7 wherein the memory comprises a Static Random Access Memory (SRAM) that includes memory cells arranged in rows controlled by word lines and columns corresponding to bit lines; the SRAM further including a sense amplifier that outputs contents of a selected memory cell as provided by the bit lines; the method comprising:
selecting the first time interval to correspond to a time period, after receipt by the memory of an index signal that selects a word line, during which a bit line connected to a selected memory cell reaches a threshold charge level prior to being connected to the sense amplifier.

10. The method of claim 7, further comprising:
receiving a process address specifying a logical memory location to be written to the memory;
based on the process address, generating, during a third time interval, a write column select signal that specifies a column in the memory that stores data corresponding to process address; and
providing, during the third time interval, a column select signal corresponding to the write column select signal to the memory.

11. The method of claim 10, further comprising performing a logical OR operation on the read column select signal and the write column select signal to produce the column select signal.

12. The method of claim 11 wherein the logical OR is performed on the write column select signal and a delayed version of the read column select signal to produce the column select signal.

13. The method of claim 7, wherein the delay element comprises a flip flop circuit.

14. A cache, comprising:
a cache memory comprising an array of memory cells configured to store data, wherein the memory cells are each uniquely selectable by a word line and column;
a cache tag unit configured to receive a memory address and, based at least in part on the memory address, determine an index value that specifies a word line in the array of memory cells and i) a read column select value that specifies a column in the array of memory to be read or ii) a write column select value that specifies a column in the array of memory to be written;
a column select control logic configured to receive the read column select value from the cache tag unit during a first time interval, wherein the column select control logic further includes a delay element that stores the read column select signal during the first time interval prior to outputting the read column select signal as a column select signal to the memory array during a second time interval such that the column select signal is not provided to the memory array during the first time interval;
wherein the cache memory is configured to connect bit lines associated with the memory cell identified by the index value and the column select value to a sense amplifier input upon receiving the column select signal from the column select control logic; and wherein the first time interval is selected to correspond to a time period after receipt by the memory array of an index signal that selects a word line during which a bit line connected to a selected memory cell charges to a threshold level prior to being connected to a sense amplifier.

15. The cache of claim 14 wherein the first time interval comprises a first clock cycle and the second time interval comprises a second clock cycle that is immediately subsequent to the first clock cycle.

16. The cache of claim 15 wherein the column select control logic includes a column select clock generation circuit that generates the clock cycles, wherein the column select clock generation circuit generates a clock cycle that operates at a slower rate with respect to a processor clock for a processor for which the cache stores data.

17. The cache of claim 14 wherein the column select control logic is further configured to receive a write column select signal in a third time interval and to provide a column select signal corresponding to the write column select signal during the third time interval to the memory array such that the column select signal is provided to the memory during the third time interval.

18. The cache of claim 14 wherein the delay element includes a flip flop circuit that stores the read column select signal for a clock cycle prior to outputting the read column select signal.

19. The cache of claim 14 wherein the column select control logic includes a logical OR gate that performs a logical OR operation on the write column select signal and a delayed version of the read column select signal.

* * * * *

UNITED STATES PATENT AND TRADEMARK OFFICE
CERTIFICATE OF CORRECTION

| | | |
|---|---|---|
| PATENT NO. | : 8,675,424 B2 | Page 1 of 1 |
| APPLICATION NO. | : 13/416270 | |
| DATED | : March 18, 2014 | |
| INVENTOR(S) | : Cho et al. | |

It is certified that error appears in the above-identified patent and that said Letters Patent is hereby corrected as shown below:

In the Claims

In column 8, line 7, in Claim 7, delete "signal;" and insert -- signal to the memory; --, therefor.

Signed and Sealed this
Eighteenth Day of August, 2015

Michelle K. Lee
*Director of the United States Patent and Trademark Office*